United States Patent
Yoshihara et al.

(10) Patent No.: US 8,797,807 B2
(45) Date of Patent: Aug. 5, 2014

(54) SEMICONDUCTOR MEMORY AND SEMICONDUCTOR MEMORY CONTROL METHOD

(75) Inventors: Masahiro Yoshihara, Yokohama (JP); Katsumi Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 13/432,708

(22) Filed: Mar. 28, 2012

(65) Prior Publication Data

US 2012/0250425 A1 Oct. 4, 2012

(30) Foreign Application Priority Data

Mar. 30, 2011 (JP) .................... 2011-076285

(51) Int. Cl.
*G11C 7/10* (2006.01)
*G11C 16/10* (2006.01)
*G11C 16/26* (2006.01)

(52) U.S. Cl.
CPC ............ *G11C 7/1078* (2013.01); *G11C 7/1087* (2013.01); *G11C 7/1051* (2013.01); *G11C 7/106* (2013.01); *G11C 16/10* (2013.01); *G11C 16/26* (2013.01)
USPC ............. 365/189.05; 365/189.04; 365/230.08

(58) Field of Classification Search
CPC .. G11C 7/1078; G11C 7/1087; G11C 7/1051; G11C 7/106; G11C 16/10; G11C 16/26
USPC ............................ 365/189.05, 189.04, 230.08
See application file for complete search history.

(56) References Cited

U.S. PATENT DOCUMENTS

| | | | | |
|---|---|---|---|---|
| 7,009,878 B2* | 3/2006 | Hosono et al. | ........... | 365/185.03 |
| 7,079,434 B2* | 7/2006 | Ha | ................ | 365/205 |
| 7,872,925 B2* | 1/2011 | Lee et al. | ................ | 365/189.05 |
| 7,908,425 B2* | 3/2011 | Lee et al. | ....................... | 711/103 |
| 7,924,621 B2 | 4/2011 | Furuta et al. | | |
| 8,081,522 B2* | 12/2011 | Murakami | ............... | 365/189.05 |
| 8,102,717 B2* | 1/2012 | Cha et al. | ................ | 365/185.25 |
| 8,179,722 B2* | 5/2012 | Huh | ........................ | 365/185.12 |
| 8,194,464 B2* | 6/2012 | Huh et al. | ................ | 365/185.22 |
| 8,289,769 B2* | 10/2012 | Lim | ........................ | 365/185.03 |
| 8,331,147 B2* | 12/2012 | Shiga | ........................ | 365/185.03 |
| 8,339,853 B2* | 12/2012 | Tokiwa | .................... | 365/185.09 |
| 8,375,179 B2* | 2/2013 | Ha | ................ | 711/154 |

(Continued)

FOREIGN PATENT DOCUMENTS

| | | |
|---|---|---|
| JP | 6-203558 | 7/1994 |
| JP | 10-334681 | 12/1998 |

(Continued)

OTHER PUBLICATIONS

Office Action issued Apr. 2, 2013 in Japanese Application No. 2011-076285 (With English Translation).

(Continued)

*Primary Examiner* — Viet Q Nguyen
(74) *Attorney, Agent, or Firm* — Oblon, Spivak, McClelland, Maier & Neustadt, L.L.P.

(57) ABSTRACT

According to one embodiment, the semiconductor memory includes a memory cell array which includes memory cells to store data, a buffer circuit which includes latches, each of the latches including transistors as control elements and a flip-flop, and a control circuit which turns off the transistors to deactivate one or more of the latches.

20 Claims, 8 Drawing Sheets

(56) References Cited

U.S. PATENT DOCUMENTS

| | | | |
|---|---|---|---|
| 8,391,072 B2 * | 3/2013 | Takagiwa | 365/185.22 |
| 8,395,940 B2 * | 3/2013 | Huh | 365/185.12 |
| 8,472,268 B2 * | 6/2013 | Hosono et al. | 365/191 |
| 8,477,541 B2 * | 7/2013 | Nakamura et al. | 365/189.05 |
| 8,488,392 B2 * | 7/2013 | Park | 365/189.05 |
| 8,498,161 B2 * | 7/2013 | Lee et al. | 365/185.25 |
| 8,503,246 B2 * | 8/2013 | Yoo et al. | 365/185.19 |
| 8,547,744 B2 * | 10/2013 | Namiki et al. | 365/185.17 |
| 8,559,223 B2 * | 10/2013 | Takashima | 365/185.05 |
| 2011/0141814 A1 | 6/2011 | Abiko | |

FOREIGN PATENT DOCUMENTS

| | | |
|---|---|---|
| JP | 11-195299 | 7/1999 |
| JP | 2002-324400 | 11/2002 |
| JP | 2003-78403 | 3/2003 |
| JP | 2004-206833 | 7/2004 |
| JP | 2007-184104 | 7/2007 |
| JP | 2007-519162 | 7/2007 |
| JP | 2009-54246 | 3/2009 |
| JP | 2009-158015 A | 7/2009 |
| JP | 2010-73245 | 4/2010 |
| JP | 2010-118123 | 5/2010 |
| WO | WO 2006/011213 A1 | 2/2006 |
| WO | WO 2009/089612 A1 | 7/2009 |

OTHER PUBLICATIONS

Office Action issued Jul. 30, 2013, in Japanese Patent Application No. 2011-076285 (with English-language translation).

* cited by examiner

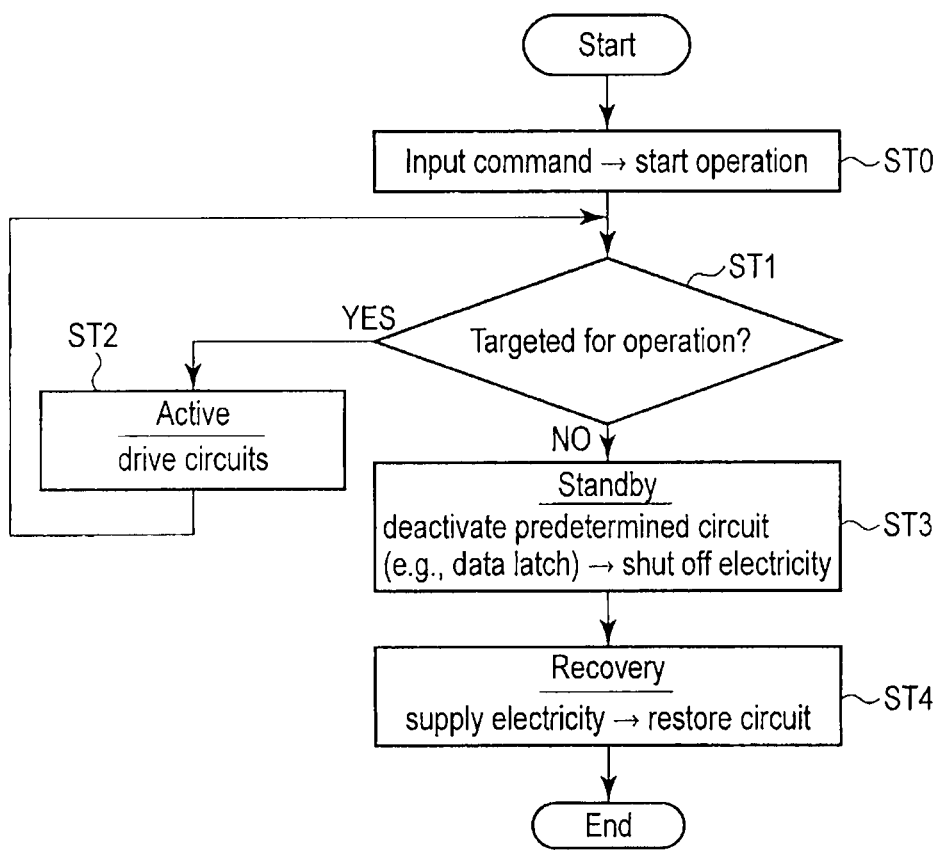
F I G. 4

SEMICONDUCTOR MEMORY AND SEMICONDUCTOR MEMORY CONTROL METHOD

CROSS-REFERENCE TO RELATED APPLICATIONS

This application is based upon and claims the benefit of priority from prior Japanese Patent Application No. 2011-076285, filed Mar. 30, 2011, the entire contents of which are incorporated herein by reference.

FIELD

Embodiments described herein relate generally to a semiconductor memory and a semiconductor memory control method.

BACKGROUND

Recently, flash memories have been used in various electronic devices as primary storage devices together with, for example, HDDs and CDs/DVDs.

For example, the reduction of power consumption is required for the flash memories.

BRIEF DESCRIPTION OF THE DRAWINGS

FIG. 4 is a flowchart showing an operation example of the semiconductor memory according to the first embodiment;

DETAILED DESCRIPTION

Hereinafter, a semiconductor memory according to an embodiment will be described in detail with reference to FIG. 1 to FIG. 6. Elements having the same functions and configurations are provided with the same signs below, and are repeatedly described when necessary.

In general, according to one embodiment, a memory cell array which includes memory cells to store data; a buffer circuit which includes latches, each of the latches including transistors as control elements and a flip-flop; and a control circuit which turns off at least one of the transistors as the control elements to deactivate one or more of the latches.

(1) First Embodiment (a) Configuration

The configuration and functions of a semiconductor memory according to the first embodiment are described with reference to FIG. 1 to FIG. 3.

Figure 1:
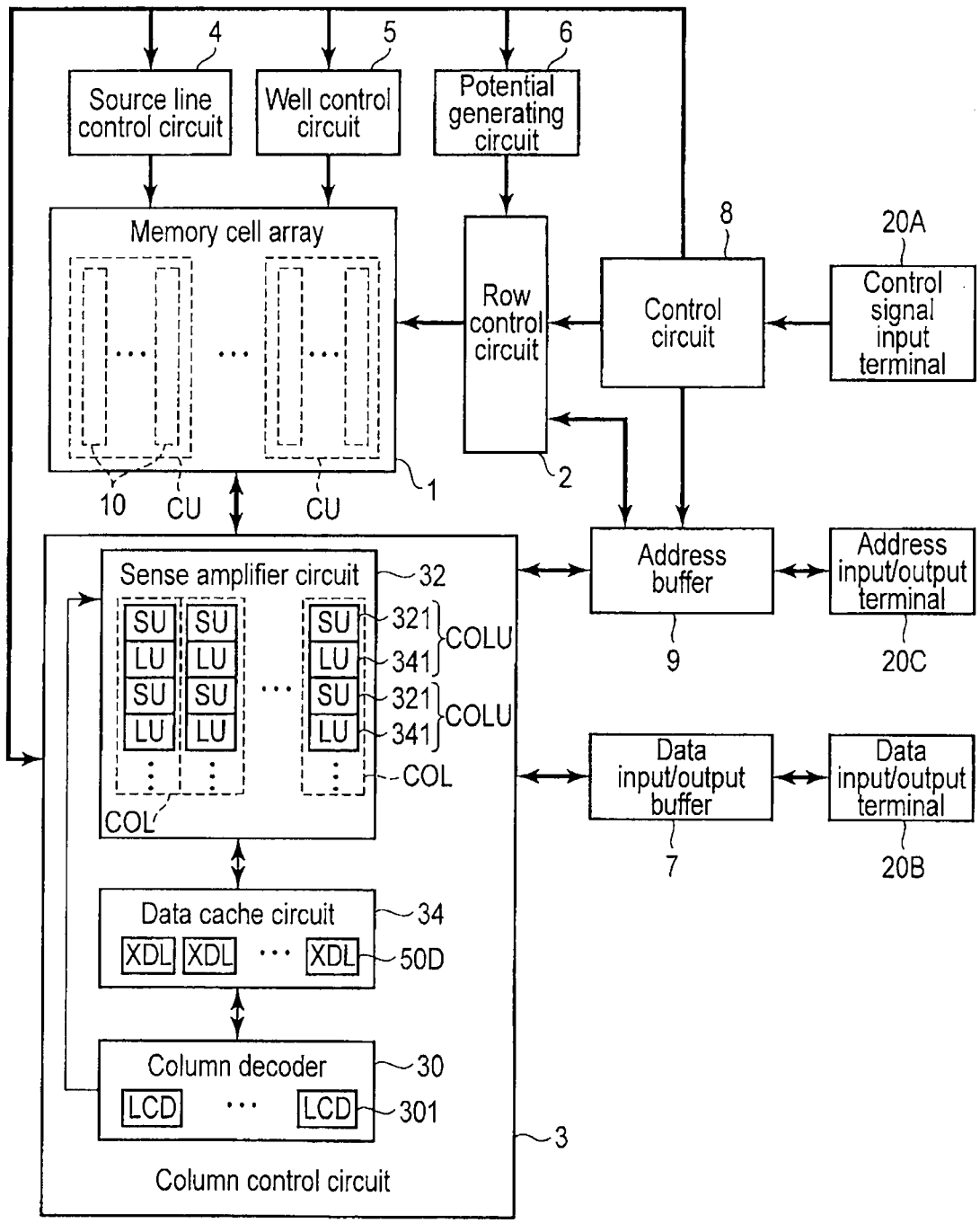
FIG. 1 is a block diagram showing an example of the circuit configuration of a semiconductor memory.

FIG. 1 is a block diagram showing the main components in the configuration of the semiconductor memory according to the present embodiment. The semiconductor memory according to the present embodiment is, for example, a non-volatile semiconductor memory. Here, a flash memory is used to illustrate the present embodiment.

A memory cell array 1 has memory cells.

The internal configuration of the memory cell array 1 shown in FIG. 1 is described with reference to FIG. 2.

When the flash memory shown in FIG. 1 is, for example, a NAND-type flash memory, the memory cell array 1 includes blocks BLK. The block BLK indicates the minimum unit of erasure.

Figure 2:
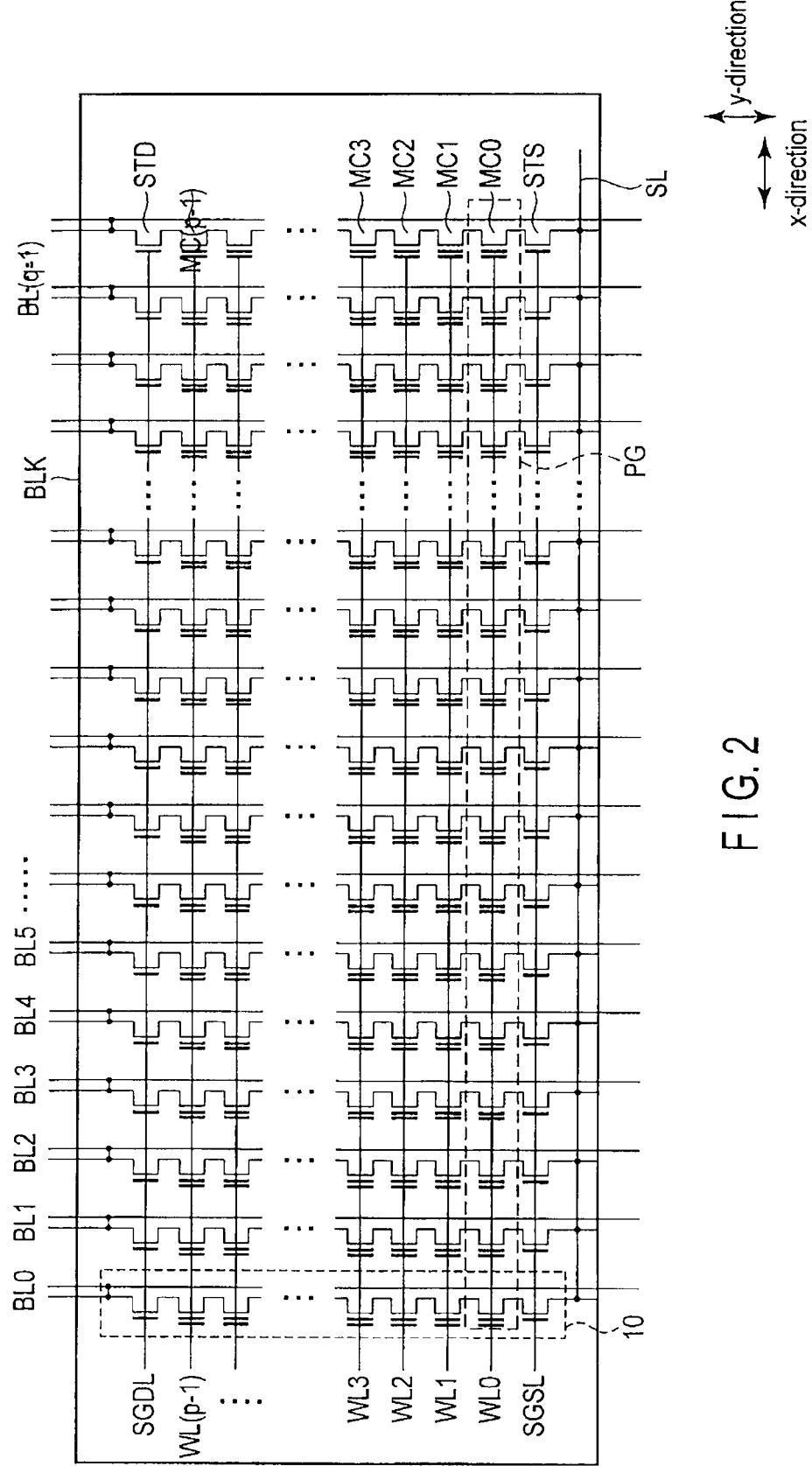
FIG. 2 is an equivalent circuit diagram showing an example of the internal configuration of a memory cell array.

FIG. 2 is an equivalent circuit diagram showing the circuit configuration of one block BLK. One block BLK includes memory cell units 10 arranged in an x-direction (first direction, row direction). For example, q memory cell units 10 are provided in one block BLK.

One memory cell unit 10 includes a memory cell string formed of (e.g., p) memory cells MC0 to MC(p−1), a first select transistor STS (hereinafter referred to as a source-side select transistor) connected to one end of the memory cell string, and a second select transistor STD (hereinafter referred to as a drain-side select transistor) connected to the other end of the memory cell string. In the memory cell string, current paths of the memory cells MC0 to MC(p−1) are connected in series along a y-direction (second direction, column direction).

A source line SL is connected to one end (source side) of the memory cell unit 10, more specifically, one end of a current path of the source-side select transistor STS. A bit line BL is connected to the other end (drain side) of the memory cell unit 10, that is, one end of a current path of the drain-side select transistor. STD.

The number of memory cells that form one memory cell unit 10 has only to be two or more, and may be, for example, 16, 32, or 64 or more. Hereinafter, the memory cells MC0 to MC(p−1) are represented by memory cells MC when not distinguished from one another.

The memory cell MC is a field effect transistor of a stack gate structure having a charge storage layer (e.g., a floating gate electrode, or an insulating film including a trap level). The source/drain of two memory cells MC adjacent in the y-direction are connected to each other. Thus, the current paths of the memory cells MC are connected in series, and the memory cell string is formed.

The drain of the source-side select transistor. STS is connected to the source of the memory cell MC0. The source of the source-side select transistor STS is connected to the source line SL.

The source of the drain-side select transistor is connected to the drain of the memory cell MC(p−1). The drain of the drain-side select transistor STD is connected to one of bit lines BL0 to BL(q−1). The number of the bit lines BL0 to BL(q−1) is the same as the number of the memory cell units 10 in the block BLK.

Word lines WL0 to WL(p−1) extend in the x-direction, and each of the word lines WL0 to WL(p−1) is shared by and connected to the gates of the memory cells MC arranged along the x-direction. In one memory cell unit 10, the number of the word lines is the same as the number of the memory cells that form one memory cell string.

A drain-side select gate line SGDL extends in the x-direction, and is shared by and connected to the gates of the drain-side select transistors STD arranged along the x-direction. A source-side select gate line SGSL extends in the x-direction, and is shared by and connected to the gates of the source-side select transistors STS arranged along the x-direction.

Hereinafter, the bit lines BL0 to BL (q−1) are represented by bit lines BL when not distinguished from one another, and the word lines WL0 to WL(p−1) are represented by word lines WL when not distinguished from one another.

Each of the memory cells MC stores external data by associating the intensity of a threshold voltage of the transistor (the distribution of the threshold voltage) with the data.

Each of the memory cells MC stores data including two levels (1 bit) or three levels (2 bits) or more.

For example, when one memory cell MC stores two-level (1-bit) data "0" and "1", the memory cell MC has two threshold distributions corresponding to these data. When one memory cell MC stores four-level (2-bit) data, "00", "01", "10", and "11", the memory cell MC has four threshold distributions corresponding to these data. A memory cell in which data having three or more levels is stored is also referred to as a multi-level memory.

Data is collectively written into and read from the memory cells MC connected to the same word line WL. A control unit of rows of the memory cell array 1 in data writing/reading is referred to as a page PG.

Data is written into and read from the multi-level memory per lower bit or per upper bit. Therefore, when the memory cell stores MC 2-bit data, two pages are allocated to one word line WL. A page collectively written or read per lower bit is referred to as a lower page. A page collectively written or read per upper bit is referred to as an upper page. A lower bit belonging to one page is referred to as lower data. An upper bit belonging to one page is referred to as upper data.

A row control circuit 2 controls the rows of the memory cell array 1. The row control circuit 2 is connected to the word lines and the select gate lines provided in the memory cell array 1. The row control circuit 2 has a row decoder and a word line driver. The row control circuit 2 selects the block BLK and the page PG (word line WL) on the basis of a row address transferred from an address buffer 9. The row control circuit 2 then controls the operations (potentials) of the word lines and the select gate lines.

A source line control circuit 4 controls the potential of the source line SL connected to the memory cell unit 10.

A well control circuit 5 controls the potential of a well region in the memory cell array 1.

A potential generating circuit 6 generates a write voltage, a read potential, an intermediate potential, and an unselect potential applied to each of the word lines WL in data writing (programming), in data reading, and in data erasing. The potential generating circuit 6 also generates, for example, potentials applied to the select gate lines. The potentials generated by the potential generating circuit 6 are transferred to the row control circuit 2, and respectively applied to a selected word line, unselected word lines, and the select gate line.

The potential generating circuit 6 generates a potential applied to the source line SL and a potential applied to the well region. The potential generating circuit 6 transfers the generated potentials to the source line control circuit 4 and the well control circuit 5.

A data input/output buffer 7 serves as a data input/output interface. The data input/output buffer 7 temporarily stores external data input via a data input/output terminal 20B. The data input/output buffer 7 temporarily stores data output from the memory cell array 1, and outputs the held data to the data input/output terminal 20B in accordance with a predetermined timing.

The address buffer 9 temporarily stores an address signal input via an address input/output terminal 20C. The external address signal is, for example, a physical address, and includes a physical row address and a physical column address.

A control circuit (e.g., a state machine) 8 manages the operation of the overall flash memory. The control circuit 8 receives a control signal (command) input from a control signal input terminal 20A. This control signal is output from, for example, a chip different from a memory chip such as a memory controller and a host device. For example, the control circuit 8 includes a command interface for receiving the control signal.

A column control circuit 3 controls columns of the memory cell array 1. The column control circuit 3 includes a column decoder 30, a sense amplifier circuit 32, and a data cache circuit (buffer circuit) 34.

The column decoder 30 selects a column of the memory cell array 1, and drives the sense amplifier circuit 32 and the data cache circuit 34 under the control of the control circuit 8.

The column decoder 30 includes local column decoders 301. The local column decoders 301 control column units CU set in the memory cell array 1. The column unit CU indicates a control unit of the bit lines BL. For example, the columns of the memory cell array 1 are controlled using the column unit CU as one control unit. A control unit referred to as a "COL" may be further set in the column unit CU. The COL (also referred to as a column group or column block) is formed of, for example, 8 bit lines (8 memory cell units).

The memory cell array may include a failure bit line (hereinafter referred to as a failure column). In this case, the failure column and the failure column unit may be replaced by a redundant column or a redundant column unit in accordance with redundancy. Information on the failure column unit or the failure column is stored, for example, in a ROM fuse or in a setting information storage unit (not shown) in the control circuit 8. A control signal (e.g., enable/disable signal) is generated from this information, and the failure column or the failure column unit is identified by the failure information and the control signal.

The sense amplifier circuit 32 is connected to the bit lines BL provided in the memory cell array 1. In data reading (in outputting of data from the memory cell array), the sense amplifier circuit 32 detects and amplifies a potential variation of the bit line BL, and determines the data stored in the memory cell MC. In data writing (in inputting of data to the memory cell array), the sense amplifier circuit 32 charges or discharges the bit line BL.

The sense amplifier circuit 32 includes sense amplifier units 321 and latch units 341. Each of the sense amplifier units 321 is connected to each bit line BL. Therefore, each of the sense amplifier units 321 corresponds to each memory cell unit 10, and can select each memory cell unit 10. The latch units 341 are arranged to correspond to the sense amplifier units 321, respectively. Combinations (referred to as COLUs) of the sense amplifier units 321 and the latch units 341 are arranged in the extending direction of the bit lines BL, and form the COLs. The COLs are arranged in a direction that intersects at right angles with the extending direction of the bit lines BL to form the sense amplifier circuit 32. The sense amplifier circuit 32 is also used, for example, as a buffer circuit.

The data cache circuit 34 has data caches 50D. Each data cache 50D is located to correspond to each COL. The data cache circuit 34 saves data, via a data bus (DBS), in the data cache 50D corresponding to the COL selected in the column decoder 30.

An internal configuration example of the latch unit 341 is described with reference to FIG. 3. FIG. 3 is an equivalent circuit diagram showing an example of the internal configuration of the latch unit 341 when the memory cell MC stores four-level (2-bit) data.

For example, each of the sense amplifier units 321 is connected to one bit line BL. In data writing, the sense amplifier unit 321 charges and discharges the bit line BL under the control of the column decoder 30 and the control circuit 8. In data reading, the sense amplifier unit 321 detects and amplifies a potential variation of the bit line BL, and determines the data stored in the memory cell MC. The sense amplifier unit 321 may also function as a latch.

Depending on the method of sensing the bit line BL, one sense amplifier unit 321 may be shared by an even bit line and an odd bit line adjacent to each other. When the sense amplifier unit 321 is shared by two bit lines, the even and odd bit lines that share the sense amplifier unit 321 are connected to the sense amplifier unit 321 in accordance with different timings depending on the operation.

The latch unit 341 is connected to the bit line BL and one memory cell unit 10 via the sense amplifier unit 321 (sense amplifier circuit 32).

The latch unit 341 temporarily stores, for example, data to be written into the memory cell, data read from the memory cell, and setting information (flag) indicating the operation for the memory cell. The latch unit 341 also has a function for amplifying a signal from the sense amplifier unit 321 or an external signal.

Figure 3:
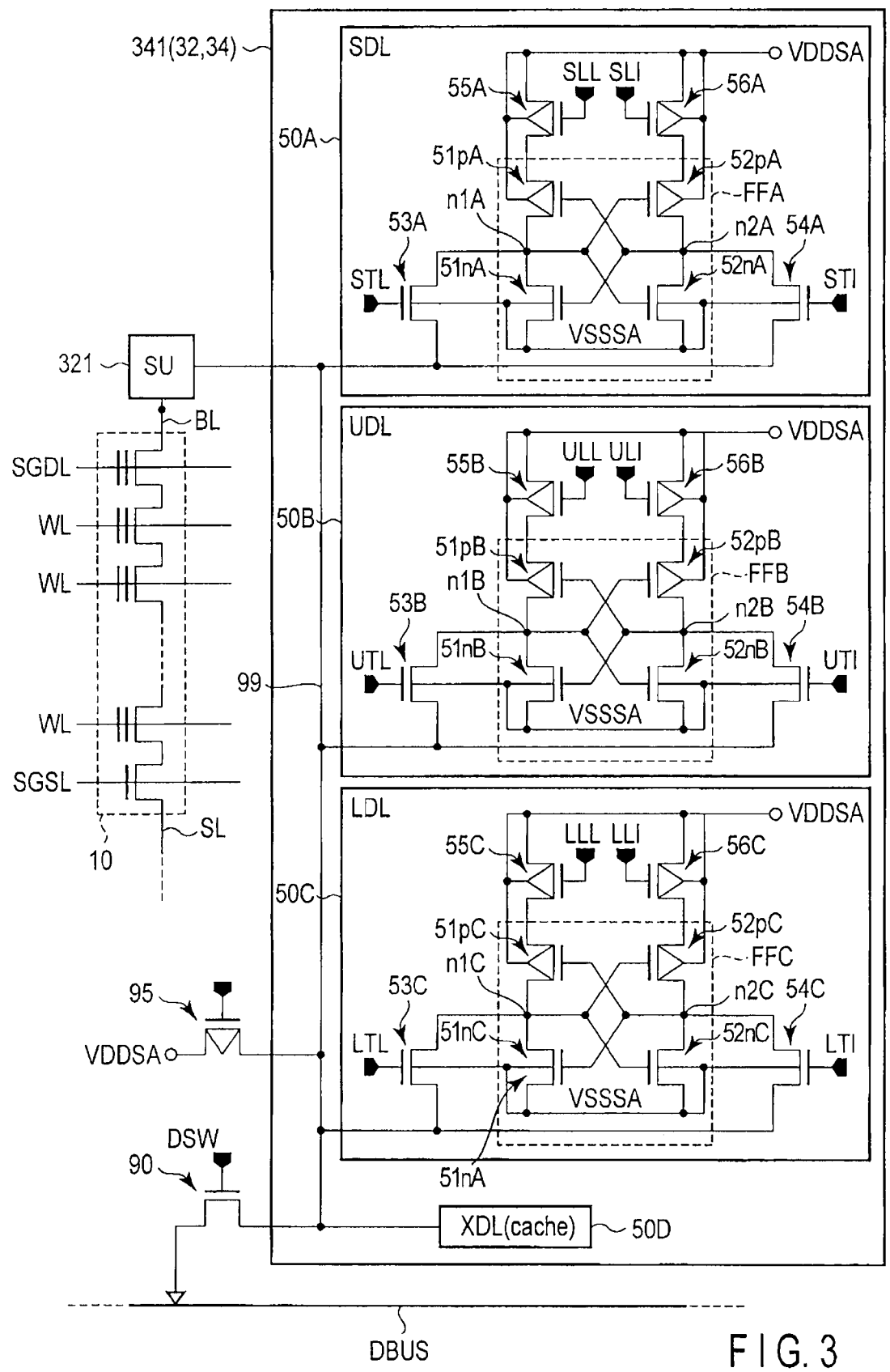
FIG. 3 is an equivalent circuit diagram showing a configuration example of a latch included in a semiconductor memory according to a first embodiment.

For example, the latch unit 341 includes at least four latches, 50A, 50B, 50C, and 50D in the example shown in FIG. 3. Each of the latches 50A, 50B, 50C, and 50D is connected to a data bus DBUS via a common interconnect (wiring line) 99 and a data bus switch 90.

The data bus switch 90 includes, for example, an n-channel type field effect transistor. One end of a current path of the data bus switch 90 is connected to the common interconnect 99, and the other end of the current path of the data bus switch 90 is connected to the data bus DBUS.

A control signal DSW is supplied to the gate of the data bus switch 90. The data bus switch 90 is turned on or off under the control of the control signal DSW.

When the data bus switch 90 is turned on, the data bus DBUS is electrically connected to the memory cell unit 10, the sense amplifier unit 321, or the latch unit 341 and the latches 50A, 50B, 50C, and 50D of the latch unit 341. For example, the data bus DBUS is set to a low potential ("L" level).

A switch (hereinafter referred to as a charge switch) 95 for charging the common interconnect 99 is connected to the common interconnect 99. One end of a current path of the charge switch 95 is connected to the common interconnect 99, and the other end of the current path of the charge switch 95 is connected to a high potential end (potential line) VDDSA (>0). A control signal LPC is supplied to the gate of the charge switch 95.

The charge switch 95 is, for example, a p-channel type field effect transistor. When the charge switch 95 is turned on by the control signal LPC at the "L" level, the potential VDDSA (>0) from a high potential side power supply is applied to the common interconnect 99, and the common interconnect 99 is charged ("H" level).

The latches 50A, 50B, 50C, and 50D in the latch unit 341 are often used for different purposes, and stored different data.

The first latch (SDL) 50A is used, for example, as a latch for temporarily storing data for the sense amplifier unit 321. For example, the latch (SDL) 50A is driven during program operation (data writing). The latch 50A is hereinafter also referred to as a temporary latch 50A.

The second latch (UDL) 50B stores the upper one bit of the 2-bit data written into the memory cell (four-level cell) or the 2-bit data read from the four-level cell. The latch 50B is hereinafter also referred to as an upper data latch 50B.

The third latch (LDL) 50C stores the lower one bit of the 2-bit data written into the four-level cell or the 2-bit data read from the four-level cell. The latch 50C is hereinafter also referred to as a lower data latch 50C.

The fourth latch (XDL) 50D is used as a latch for cache operation. The latch (XDL) 50D stores data output in response to a command for cache reading. The latch 50D is hereinafter also referred to as a cache latch 50D.

In addition to the four latches 50A, 50B, 50C, and 50D, a latch for storing a flag in data writing and a latch for storing verification results (bit scans) may be provided in the latch unit 341. Although the configuration of the latch unit when the multi-level memory is used is shown here, the latch unit 341 may be formed of at least three latches when a two-value memory is used.

Hereinafter, the latches 50A, 50B, 50C, and 50D in the latch unit 341 are represented by latches 50 when not distinguished from one another. These latches may be hereinafter also referred to as data latches.

The temporary latch 50A is formed of eight field effect transistors (e.g., MOS transistors 51nA, 51pA, 52nA, 52pA, 53A, 54A, 55A, and 56A). In the temporary latch 50A, the four field effect transistors 51nA, 51pA, 52nA, and 52pA form a flip-flop FFA.

In the flip-flop FFA, one n-channel type field effect transistor 51nA and one p-channel type field effect transistor 51pA are inverter-connected.

One end of a current path of the n-channel type field effect transistor 51nA is connected to one end of a current path of the p-channel type field effect transistor 51pA. When the current paths of the two transistors 51nA and 51pA are connected to each other, a connection node (LAT_S) n1A is formed. The other end of the current path of the n-channel type field effect transistor 51nA is connected to a low potential end (low potential line) VSSA (e.g., ground potential=0 V), and grounded. The other end of the current path of the p-channel type field effect transistor 51pA is connected to one end of a current path of the field effect transistor 55A as a switch element. The other end of the current path of the p-channel type field effect transistor 51pA is connected to the high potential end (high potential line) VDDSA via the field effect transistor 55A. The gates of the two field effect transistors 51nA and 51pA are connected to each other.

In the flip-flop FFA, one n-channel type field effect transistor 52nA and one p-channel type field effect transistor 52pA are inverter-connected.

One end of a current path of the n-channel type field effect transistor 52nA is connected to one end of a current path of the p-channel type field effect transistor 52pA. When the current paths of the two transistors 52nA and 52pA are connected to each other, a connection node (INV_S) n2A is formed. The other end of the current path of the n-channel type field effect transistor 52nA is connected to the low potential line VSSA, and grounded. The other end of the current path of the p-channel type field effect transistor 52pA is connected to one end of a current path of the field effect transistor 56A as a switch element. The other end of the current path of the p-channel type field effect transistor 52pA is connected to the high potential end (high potential line) VDDSA via the switch 56A. The gates of the two field effect transistors 52nA and 52pA are connected to each other.

The gates of the field effect transistors 51nA and 51pA that form an inverter are connected to the connection node n2A. The gates of the field effect transistors 52nA and 52pA that form an inverter are connected to the node n1A.

The four field effect transistors 51nA, 51pA, 52nA, and 52pA are thus used to form the flip-flop FFA as a substantial data holder of the latch 50A.

The field effect transistor 55A as a switch is, for example, a p-channel type field effect transistor.

The other end of the field effect transistor 55A is connected to the high potential end (high potential line) VDDSA (>0). A control signal SLL is supplied to the gate of the field effect transistor 55A. The field effect transistor 55A controls the application of the drive potential VDDSA to the p-channel type field effect transistor 51pA in the flip-flop FFA in conformity with the control signal SLL.

The field effect transistor 56A as a switch is, for example, a p-channel type field effect transistor. The other end of the field effect transistor 56A is connected to the potential line VDDSA. A control signal SLI is supplied to the gate of the field effect transistor 56A. The field effect transistor 56A controls the application of the drive potential VDDSA to the p-channel type field effect transistor 52pA in the flip-flop FFA in accordance with the control signal SLI.

For clarity of explanation, the field effect transistors 55A and 56A which control the supply of the drive potential VDDSA to the flip-flop FFA are hereinafter referred to as drive switches 55A and 56A.

One end of a current path of the field effect transistor 53A as a transfer gate is connected to one connection node n1A in the flip-flop FFA. The other end of the current path of the field effect transistor 53A is connected to the data bus DBUS via the common interconnect 99 and the data bus switch 90. A control signal STL is supplied to the gate of the field effect transistor 53A. The field effect transistor 53A controls the potential level of the connection node n1A in accordance with the control signal STL. The field effect transistor 53A is, for example, an n-channel type field effect transistor.

One end of a current path of the field effect transistor 54A as a transfer gate is connected to the other connection node n2A in the flip-flop FFA. The other end of the current path of the field effect transistor 54A is connected to the data bus DBUS via the common interconnect 99 and the data bus switch 90. A control signal STI is supplied to the gate of the field effect transistor 54A. The field effect transistor 54A controls the potential level of the connection node n2A in accordance with the control signal STI. The field effect transistor 54A is, for example, an n-channel type field effect transistor.

The transistor as the drive switch is not exclusively the p-channel type field effect transistor. The transistor as the transfer gate is not exclusively the n-channel type field effect transistor either.

Hereinafter, the n-channel type field effect transistor is simply referred to as an n-type transistor, and the p-channel type field effect transistor is simply referred to as a p-type transistor. The p-type transistor and the n-type transistor may otherwise be referred to as "field effect transistors", "drive switches", or "transfer gates".

The other latches 50B, 50C, and 50D have substantially the same circuit configuration as the temporary latch (SDL) 50A.

That is, as shown in FIG. 3, the upper data latch (UDL) 50B includes four transistors, 51nB, 51pB, 52nB, and 52pB that form a flip-flop FFB, two p-type transistors, 55B and 56B as drive switches, and two n-type transistors, 53B and 54B as transfer gates. The transistors 51nB, 51pB, 52nB, 52pB, 53B, 54B, 55B, and 568 in the upper data latch (UDL) 50B are connected in substantially the same manner as the transistors in the temporary latch (SOL) 50A.

A control signal ULL is supplied to the gate of the drive switch 55B, and a control signal ULI is supplied to the gate of the drive switch 568.

One end of a current path of the transfer gate 53B is connected to a connection node (LAT_U) n1B in the flip-flop FFB, and one end of a current path of the transfer gate 54B is connected to a connection node (INV_U) n2B in the flip-flop FFB. A control signal UTL is supplied to the gate of the transfer gate 53B, and a control signal UTI is supplied to the gate of the transfer gate 54B.

Similarly, the lower data latch (LDL) 50C includes four field effect transistors, 51nC, 51pC, 52nC, and 52pC that form a flip-flop FFC, two drive switches (p-type transistors), 55C and 56C, and two transfer gates (n-type transistors), 53C and 54C.

A control signal LLL is supplied to the gate of the drive switch 55C, and a control signal LLI is supplied to the gate of the drive switch 56C.

One end of a current path of the transfer gate 53C is connected to a connection node (LAT_L) n1C in the flip-flop FFC, and one end of a current path of the transfer gate 54C is connected to a connection node (INV_L) n2C in the flip-flop FFC. A control signal LTL is supplied to the gate of the transfer gate 53C, and a control signal LTI is supplied to the gate of the transfer gate 54C.

When the components in the latches 50 are not distinguished from one another, the components are hereinafter represented by transistors 51n, 51p, 52n, and 52p, drive switches 55 and 56, and transfer gates 53 and 54. The flip-flops FFA, FFB, and FFC are represented by flip-flops FF when not distinguished from one another.

In the latches 50, a back bias (substrate bias) VSSSA is applied to the n-type transistors 51n, 52n, 53, and 54, and a back bias (substrate bias) VDDSA is applied to the p-type transistors 51p, 52p, 55, and 56.

The operation of the latch 50 in the data cache circuit (page buffer or buffer circuit) 34 is described here.

When the latch 50 is active, the drive switches 55 and 56 are turned on, and the drive potential VDDSA (>0) is applied to one end of the current paths of the two p-type transistors 51p and 52p that form the flip-flop FF via the current paths of the drive switches 55 and 56 in an on-state. When the latch 50 is storing data, the transfer gates 53 and 54 are turned off.

The operation for outputting the data saved in the latch 50A to the data bus DBUS is described here. The operation mainly described here extends to the transfer of the data saved in the latch 50A to the cache latch (XDL) 50D via the interconnect 99. After the data is transferred to the cache latch SOD, the data bus switch 90 is turned on, and the cache latch 50 and the data bus DBUS are electrically connected to each other. As a result, the data in the cache latch 50 is transferred to the data bus DBUS.

Described is the operation wherein when the node n2A is at an "L" level (data "L"), the data "L" is output from the node n2A to the data bus DBUS. In this case, as a node n1A is at an "H" level, the field effect transistor 52nA is turned on. The interconnect 99 which is indeterminate in the initial state is precharged to the potential VDDSA by using the switch 95. The control signal STI is raised to an "H" level so that the n-type transistor (transfer gate) 54A is turned on. As a result, the potential level of the interconnect 99 reaches an "L" level via the n-type transistor 54A. When the interconnect 99 is sufficiently discharged to an "L" level, the cache latch (XDL) 50D takes in the potential level of the interconnect 99 as data "L".

A similar procedure is applied to the situation where when the node n1A is at an "L" level (data "L"), the data "L" is output from node n1A to the data bus DBUS. The control signal STL is raised to an "H" level so that the n-type transistor (transfer gate) 53A is turned on. As a result, the interconnect 99 reaches an "L" level via the n-type transistor 53A.

At this moment, the interconnect 99 and the nodes n1A and n2A are connected to the n-type transistors (transfer gates) 53A and 54A (not directly connected to the flip-flop ETA). Therefore, even if the potential of the node n1A or the node n2A rises due to the flow of the charge of the interconnect 99 into the node n1A or the node n2A, the potential of the node n1A or n2A does not rise to the thresholds of the n-type transistors 53A and 54A or more. Moreover, the data stored in both the node n1A and the node n2A can be output to the interconnect 99. Thus, the data stored in one of the two nodes n1A and n2A from which the interconnect 99 discharges electricity fewer times is output, so that extra discharge of the interconnect 99 can be avoided, and a current consumed by the next precharge can be reduced.

Now, the operation for inputting the data "H" or the data "L" to the node n2A from the interconnect 99 is described. Since the interconnect 99 and the latch are only connected by the n-type transistors 53A and 54A, the node n1A and the node n2A cannot be charged to the potential VDD directly from the interconnect 99.

Thus, the interconnect 99 which is indeterminate in the initial state is discharged to the ground potential VSS from a predischarge transistor (not shown). In accordance with the timing whereby the interconnect 99 can be sufficiently discharged, the control signal SLI is raised to an "H" level so that the p-type transistor 56A is turned off. The control signal STI is then raised to an "H" level, and the n-type transistor 54A is turned on accordingly. The node n2A is connected to the interconnect 99, and discharged to the potential VSS. Therefore, the node n1A is set to an "H" level because the p-type transistor 55A is turned on by the control signal SLL at an "L" level.

The control signal SLI and the control signal STI are then raised to an "L" level in this order. Further, the predischarge transistor is turned off, and the interconnect 99 is charged to the potential VDDSA via the switch 95. An "H" or "L" level is then output to the interconnect 99 from the cache latch 50D. When the output data of the cache latch 50D is at an "H" level, the potential level of the interconnect 99 keeps the potential VDDSA. When the output data of the cache latch 50D is at an "L" level, the interconnect 99 is discharged to the potential VSS.

In this condition, the levels of the control signal SLL and the control signal STL are raised to an "H" level in this order, and the potential. VDDSA or the potential VSS of the interconnect 99 is transferred to the node n1A via the n-type transistor 53A. The node n1A is kept at the potential VDDSA or discharged to the potential VSS. As the p-type transistor 56A is turned on due to the control signal SLI at an "L" level, the node n2A reaches the potential VSS or the potential VDDSA.

When the data state of the latch 50 is inverted, that is, when the latch 50 is used as an inverter, the following operation is performed.

When the potential level of the node n1 of the latch 50 is set to an "L(0)" level and the potential level of the node n2 of the latch 50 is set to an "H(1)" level, for example, the data bus switch 90 is turned on, and the interconnect 99 is electrically connected to the data bus DBUS at an "L" level. As a result, the potential level of the interconnect 99 is set to an "L" level. The drive switches 55 and 56 are turned on, and the potential VDDSA is applied to the flip-flop FF.

Furthermore, the transfer gate 53 connected to the node n1 is turned on by a control signal at an "H" level, and the transfer gate 54 connected to the node n2 is turned off by a control signal at an "L" level. As a result, the node n1 is electrically connected to the interconnect 99 at an "L" level, and the potential level of the node n1 is shifted to an "L" level.

On the other hand, the node n2 is electrically disconnected from the interconnect 99 at an "L" level by the transfer gate 54 in an off-state. The potential level of the node n2 is then set to a reversal potential ("H" level) of the potential level of the node n1 by the flip-flop FF.

When the potential level of the node n1 of the latch 50 is set to an "H" level and the potential level of the node n2 of the latch 50 is set to an "L" level, for example, the interconnect 99 is set to an "L" level by the data bus switch 90 in an on-state, and the drive potential VDDSA is applied to the flip-flop FF by the drive switches 55 and 56 in an on-state.

Furthermore, the transfer gate 53 connected to the node n1 is turned off by a control signal at an "L" level, and the transfer gate 54 connected to the node n2 is turned on by a control signal at an "H" level. As a result, the node n2 is electrically connected to the interconnect 99 at an "L" level, and the potential level of the node n2 is shifted to an "L" level.

The node n1 is electrically disconnected from the interconnect 99 at an "L" level by the transfer gate in an off-state. The potential level of the node n1 is then set to a reversal potential ("H" level) of the potential level of the node n2 by the flip-flop FF.

The data held in the latch 50 is rewritten by the operation described above.

In writing data into the latch 50, the switch 95 connected to the high potential end may be used instead of the data bus switch 90. In this case, the potential level of the interconnect 99 is set to an "H" level so that the potential levels of the nodes n1 and n2 are charged to an "H" level. The data in the latch 50 is rewritten by the charging of the nodes n1 and n2. In reading data from the latch 50, for example, the transfer gate 53 may be turned on, and the potential level of the node n1 is output as the data stored in the latch 50.

For example, the latch 50 in the latch unit 341 according to the present embodiment may be in the following standby state.

Both the drive switches 55 and 56 in the latch 50 are turned off. For example, when the drive switches 55 and 56 are p-type transistors 55 and 56, a potential VDDA is applied to the gates of the drive switches 55 and 56. Both the transfer gates 53 and 54 are turned on, and the nodes n1 and n2 are connected to the data bus DBUS via the data bus switch 90 in an on-state.

Here, the ground potential VSS is applied to the data bus DBUS, and both the nodes n1 and n2 of the latch 50 are set to an "L" level. Therefore, the n-type transistors $51n$ and $52n$ forming the flip-flop FF are turned off, and the p-type transistors $51p$ and $52p$ forming the flip-flop FF are turned on. That is, the latch 50 is the inactive state without any shoot-through current. As a result, power consumption can be reduced.

The driving state (inactive state) of the latch 50 whereby both the nodes n1 and n2 are set to an "L" level is hereinafter referred to as a standby state. However, the data stored in the latch 50 is destroyed in the standby state of the latch 50.

In the standby state of the latch 50, the intensity of a leak current generated in the latch 50 is substantially determined by the off-leak currents (also referred to as subthreshold leak currents or off-state leak currents) of the p-type transistors 55 and 56.

When the data state of the latch is maintained, that is, when the two nodes n1 and n2 of the flip-flop FF are at complementary potential levels, one n-type transistor and one p-type transistor are turned on in the flip-flop FF. In this case, the intensity of the leak current generated in the latch 50 is determined by the off-leak current generated when the off-leak current of one n-channel type field effect transistor and one p-channel type field effect transistor are connected in series or by the off-leak current generated when two p-channel type field effect transistors are connected in series.

In the flash memory according to the present embodiment, the control circuit 8 individually manages the operations of the components in the column control circuit 3 by a control unit (e.g., per bit line or column unit) in accordance with the operation status (selection state or active state) of the columns of the memory cell array 1, for example, during the operation of the memory. In this management condition, the control circuit 8 reduces the power consumption of the memory.

The control circuit 8 in the flash memory according to the present embodiment detects, for example, the operation statuses of the columns of the memory cell array 1 and the corresponding circuits. In response to the detection of the operation statuses, the control circuit 8 sets the circuits corresponding to the unselected (not activated) columns to an inactive state (standby state). Depending on the operation of the memory, the control circuit 8 may set the whole internal configuration in the column control circuit 3 to a standby state.

The control circuit 8 has, for example, an operation status detecting unit for detecting the operation statuses of the circuits in the column control circuit 3.

The control circuit 8 (or operation status detecting unit) detects the operation status of the column unit CU or the memory cell unit 10, for example, in accordance with a column address, the driving state of the local column decoder 301 (the position of a pointer), a command, or a control signal.

When the column unit CU and the memory cell unit 10 that are not selected (not driven) are detected by the control circuit 8 or the operation status detecting unit, the control circuit 8 sets, to a waiting state (inactive state or standby state), the circuit that causes no trouble if stopped, among the components in the column control circuit 3 corresponding to the column unit CU and the memory cell unit 10.

For example, the control circuit 8 sets, to a waiting state (standby state), some of the latches 50 in the latch unit 341 corresponding to the column unit CU and the memory cell unit 10 that are not selected.

Among the latches in the latch unit 341, the lower data latch 50C and the cache latch 50D are used for cache reading. Therefore, even if the column unit CU and the memory cell unit 10 are not selected, the control circuit 8 activates the lower data latch 50C and the cache latch 50D, and supplies power to operate the latches 50C and 50D.

In the meantime, among the latches in the latch unit 341, the temporary latch 50A and the upper data latch 50B do not have to be driven if the column unit CU and the memory cell unit 10 are not selected. Therefore, the control circuit 8 deactivates the temporary latch 50A and the upper data latch 50B corresponding to the column unit CU and the memory cell unit 10 that are not selected, and the control circuit 8 shuts off the supply of electricity to the latches 50A and 50B.

For example, when the latch 50 is set to a standby state (waiting state or inactive state), the control circuit 8 controls the operation of setting a latch 50 to a standby state from an active state in accordance with a control signal FIVEON.

For example, in accordance with a control signal at an "L" level, the control circuit 8 applies, to the gates of the p-type transistors 55 and 56 as the drive switches, a potential VDDA (e.g., power supply potential) which turns off the p-type transistors, and stops the application of the drive potential VDDSA to the flip-flop FF. The control circuit 8 also turns on both the n-type transistors 53 and 54 as the transfer gates, and connects both the nodes n1 and n2 to the ground potential ("L" level).

As a result, the potential level of the nodes n1 and n2 of the flip-flop FF becomes an "L" level. In the flip-flop FF of the latch 50, the n-type transistors 51$n$ and 52$n$ forming the flip-flop FF are turned off, and the p-type transistors 51$p$ and 52$p$ forming the flip-flop FF are turned on.

Here, it is described that the off-leak current of the n-type transistor is lower than the off-leak current of the p-type transistor. Even when the off-leak current of the p-type transistor is higher than the off-leak current of the n-type transistor, the off-leak current of the p-type transistor can be lower than the off-leak current of the n-type transistor by using a voltage higher than the potential VDDSA as the control signals SLL and SLI applied to the gate electrode of the p-type transistor.

Here, if the latch 50 kept at an "H" level or "L" level is set to a standby state, the intensity of the off-leak current is equal to the sum of the leak currents of the two p-type transistors connected in series and the leak currents of the one p-type transistor and one n-type transistor that are connected in series.

In the present embodiment, when both the nodes n1 and n2 of the latch 50 are set to an "L" level during the standby state (also referred to as a standby period) of the latch 50, the intensity of the leak current generated in the latch 50 is substantially determined by the off-leak currents of the two p-type transistors (drive switches) 55 and 56. The latch 50 in the standby state consumes electricity corresponding to the off-leak currents of the two p-type transistors 55 and 56. That is, if the off-leak current of the p-type transistor is lower than the off-leak current of the n-type transistor, the power consumption of the off-leak current when the two series connection of the two p-type transistors is connected in parallel is less than the power consumption of the off-leak current when the series connection of the two p-type transistors and the series connection of one p-type transistor and one n-type transistor are connected in parallel.

As heretofore, when the latch 50 is storing data at an "H" level or "L" level, the intensity of the off-leak current in this condition is the sum of the leak currents of one p-type transistor and one n-type transistor that are connected in series. That is, the flash memory according to the present embodiment can reduce the off-leak current by more than that in conventional techniques.

In the latch 50 used in the data cache circuit 34 of the flash memory according to the present embodiment, the nodes n1 and n2 of the flip-flop included in the latch 50 are set to an "L" level so that the power consumption of the latch 50 in the standby state, and the latch unit 341 and the data cache circuit 34 that include the latch 50 can be lower than when the data storing state of the latch 50 is kept or than when a latch having a different circuit configuration (e.g., a latch using a clocked inverter) is used.

At this moment, the data storing state (active state) of the latches (e.g., the lower data latch and the cache latch) used for cache reading is kept. Therefore, in the present embodiment, deterioration of the operation speed of the flash memory is inhibited.

A failure column unit or a failure column may be generated in the memory cell array 1. In this case, the control circuit 8 turns off the drive switches 55 and 56 in the latch 50 in the latch unit 341 corresponding to the failure column in accordance with stored information on the failure column/failure column unit, a control signal for the failure column/failure column unit, or a control signal for redundancy (redundant column), thus setting the potential level of the nodes n1 and n2 of the flip-flop FF to an "L" level. This makes it possible to reduce the power consumption of the latch 50 in the latch unit (sense amplifier circuit and data cache circuit) corresponding to the failure column unit and the failure column.

In the present embodiment, the leak current can be reduced, so that noise resulting from the leak current can be reduced.

Along with the increase of the storage capacity of memories, the number of the latch units 341 corresponding to the column units CU and the memory cell units 10 and the number of the latches 50 in the latch unit 341 tend to increase. Thus, as in the present embodiment, setting the latches which do not have to be kept in the data storing state (which allow the data therein to be destroyed) to a standby state (electricity shut state) to reduce the power consumption of the flash memory or noise is effective.

Consequently, the semiconductor memory according to the present embodiment can reduce its power consumption.

(b) Operation

The operation of the semiconductor memory (e.g., flash memory) according to the first embodiment is described with reference to FIG. 4 to FIG. 6. FIG. 1 to FIG. 3 are also used to explain the operation of the flash memory according to the present embodiment.

The operation of the column control circuit 3 in inputting data to and outputting data from the memory cell array is mainly described below in connection with the operation of the flash memory according to the present embodiment. The control of the columns by the column control circuit 3 only varies in the direction (the order of data transfer) of inputting data to and outputting data from the memory cell array 1 (column unit CU). The control of the columns by the column control circuit 3 remains substantially the same in inputting data to the memory cell array (memory writing operation) and in outputting data from the memory cell array (memory reading operation). Therefore, the memory writing and reading operations are not described in detail.

FIG. 4 is a flowchart showing an operation example of the flash memory according to the present embodiment. FIG. 5 and FIG. 6 are timing charts showing an operation example of the flash memory according to the present embodiment.

As shown in FIG. 4, when there is an external request to input data to or output data from the memory cell array 1, a write command or a read command is externally input to the control circuit 8 via the control signal input terminal 20A (step ST0). Along with the input of this command, an address signal (physical address) is input to the address buffer 9 via the address signal terminal 200. For example, when a write command is input, external data is input to the data input/output buffer 7 via the data input/output terminal 20B together with the command and the address signal.

In response to the input of the command and the address signal, the control circuit 8 drives the row control circuit 2 and the column control circuit 3. As a result, the block BLK, the page PG, the column unit CU, and the memory cell unit 10 indicated by the address signal are activated. For example, in data writing or data reading, one page of data is written into or read from an address of the memory cell array in the flash memory. Although the column unit CU and the memory cell unit 10 are hereinafter used as a column control/driving unit, the above-mentioned "COL" may be used as the control/driving unit.

The potential generating circuit 6 generates, for example, a write potential, a read potential, and an unselect potential in accordance with the input command. The potential generating circuit 6 also generates potentials for the source line control circuit 4 and the well control circuit 5. The source line control circuit 4 and the well control circuit 5 apply the potentials generated by the potential generating circuit 6 to the source line and a well.

The row control circuit 2 controls the row of the memory cell array 1 under the control (command) of the control circuit 8 and in accordance with the address signal. The row control circuit 2 activates the block (hereinafter referred to as a selected block) BLK and the page (hereinafter referred to as a selected page) PG indicated by the row address. The row control circuit 2 then transfers and applies predetermined potentials to word lines and the select gate line respectively.

The column control circuit 3 controls the column unit CU and the memory cell unit 10 of the memory cell array 1 under the control (command) of the control circuit 8 and in accordance with the address signal. The column decoder 30 and the local column decoder 301 therein control the active/inactive states of the column unit (hereinafter referred to as a selected column unit) CU and the memory cell unit (hereinafter referred to as a selected memory cell unit or a selected bit line) 10 that are indicated by the column address.

The operation status detecting unit in the control circuit 8 detects the operation statuses of the column unit CU and the memory cell unit 10 in accordance with a control signal or an address (step ST1). For example, the control circuit 8 detects whether the memory cell array 1, the column unit CU, or the memory cell unit 10 is active or inactive in accordance with a busy/ready signal BUSYn, the fiveon signal FIVEON corresponding to the busy/ready signal BUSYn, the input column address, and the driving statuses of the column decoder 30 and the local column decoder 301.

When the control circuit 8 or the operation status detecting unit judges by the detection result that the column unit CU and the memory cell unit 10 are targeted for operation (selected or active), the circuits in the column control circuit 3 corresponding to the column unit CU and the memory cell unit 10 are activated by the control circuit 8, and driven in accordance with a command (step ST2). On the other hand, when the operation status detecting unit judges by the detection result that the column unit CU and the memory cell unit 10 are not targeted for operation or that the operations of the column unit CU and the memory cell unit 10 have been completed, the control circuit 8 sets the circuits in the column control circuit 3 corresponding to the column unit CU and the memory cell unit 10 (bit line BL) to a standby state (inactive state) (step ST3).

The operation of the flash memory according to the present embodiment is described below illustrating the case where the active state/standby state of the latch 50 in the data cache circuit 34 is controlled by the fiveon signal FIVEON.

Figure 5:
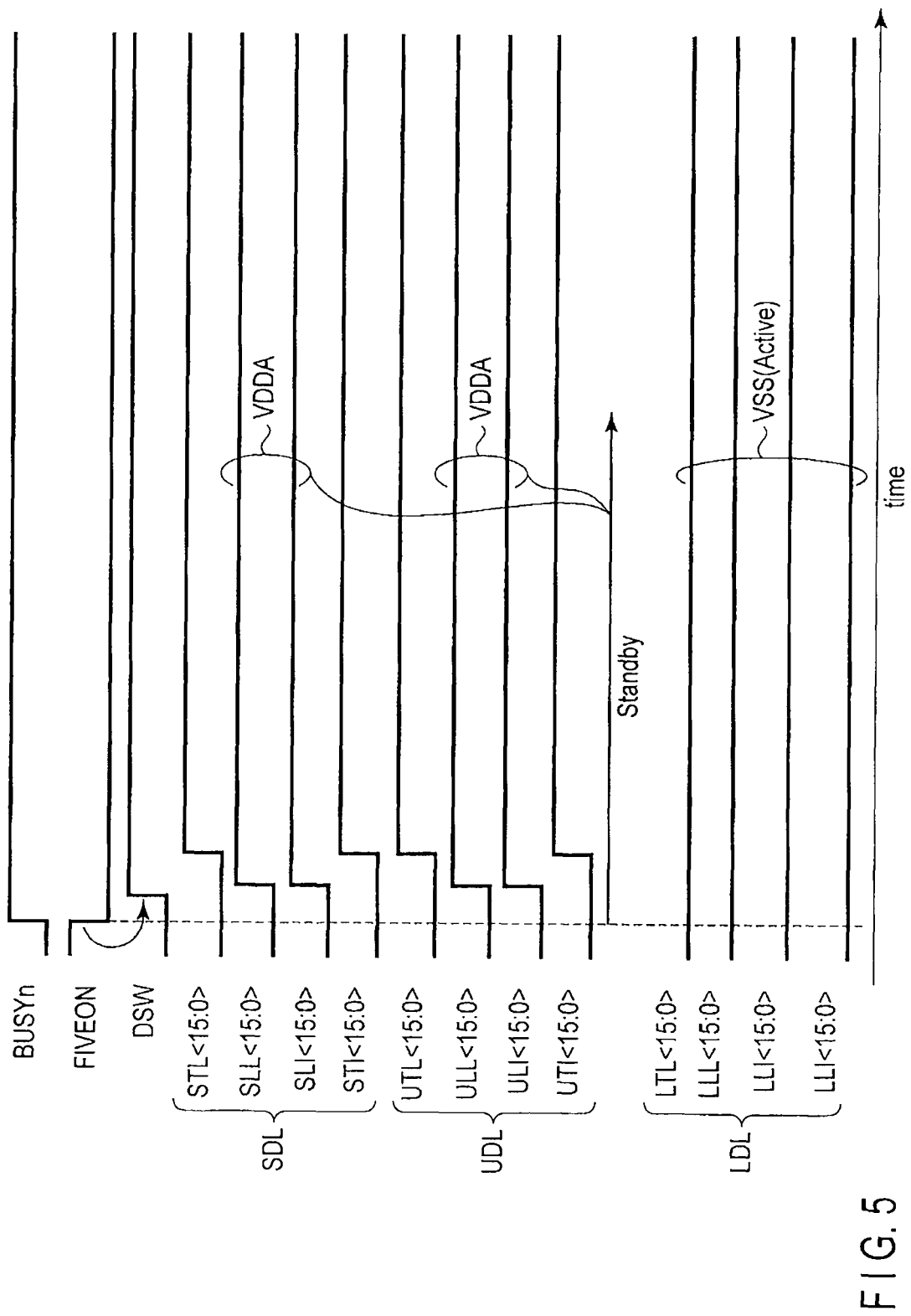
FIG. 5 is a timing chart showing an operation example of the semiconductor memory according to the first embodiment.

FIG. 5 shows a timing chart of the operation wherein the latch 50 in the latch unit 341 included in the data cache circuit 34 is shifted to a standby state (also referred to as an inactive state or a waiting state) from an active state under the control of the control circuit 8. The operation for setting the circuit (here, the latch 50) to a standby state from an active state is hereinafter referred to as the standby operation.

For example, it is preferable that among the latches 50 in the latch unit 341, the lower data latch 50C and the cache memory 500 are kept active in consideration of cache reading from the memory. In the meantime, the temporary latch 50A and the upper data latch 50B for the sense amplifier unit 321 may be set to a standby state. In the case described here, the standby operation is performed for the temporary latch 50A and the upper data latch 50B in the latch unit 341.

For example, in the present embodiment, the fiveon signal FIVEON is a control signal which changes its signal level substantially complementarily to the busy signal BUSYn.

As shown in FIG. 5, the fiveon signal FIVEON shifts to an "L" level from an "H" level synchronously with the shift of the busy signal BUSYn to an "H" level from an "L" level.

After the fiveon signal FIVEON has shifted to an "L" level, the control signal DSW of the data bus switch 90 is set to an "H" level from an "L" level under the control of the control circuit 8. Accordingly, the data bus switch 90 is turned on, and the common interconnect 99 to which the latches 50A, 50B, and 50C are connected is connected to the data bus DBUS. For example, the potential level of the data bus DBUS is set to an "L" level.

For example, the standby operation is performed so that the (e.g., 16) memory cell units 10 (bit lines BL) serve as one control unit. In this case, as the latches 50 are provided to correspond to the memory cell units 10, 16 temporary latches 50A and 16 upper data latches 50B are set to a standby state. The standby operation may be performed for 16 or more latch units at the same time.

For example, after the signal level of the control signal DSW is set to an "H" level, the signal levels (potential levels) of the control signal SLL<15:0> and the control signal SLI<15:0> for the temporary latch (SDL) 50A are shifted to an "H" level from an "L" level by the control circuit 8. The potential VDDA corresponding to an "H" level is applied to the gates of p-type transistors 55pA and 56pA as drive switches in the temporary latch 50A, and the p-type transistors 55pA and 56pA are turned off. The application of the drive potential VDDSA to the flip-flop FFA of the temporary latch 50A is shut off by the drive switches 55pA and 56pA in an off-state.

Substantially at the same time, the signal levels of the control signal ULL<15:0> and the control signal ULI<15:0> for the upper data latch (UDL) 50B are shifted to an "H" level from an "L" level. The potential VDDA corresponding to an "H" level is applied to the gates of p-type transistors 55pB and 56pB as drive switches in the upper data latch 50B, and the p-type transistors 55pB and 56pB are turned off. The application of the drive potential VDDSA to the flip-flop FFB of the upper data latch 50B is shut off by the drive switches 55pB and 56pB in an off-state.

After the drive switches 55 and 56 are turned off, the control signal STL<15:0> and the control signal STI<15:0> for the temporary latch 50A are shifted to an "H" level from an "L" level under the control of the control circuit 8. A potential at an "H" level is applied to the gates of the n-type transistors 53A and 54A as the transfer gates in the temporary latch 50A, and the two transfer gates 53A and 54A are turned on.

Substantially at the same time, the signal levels of the control signal UTL<15:0> and the control signal UTI<15:0> for the upper data latch 50B are shifted to an "H" level from an "L" level. A potential at an "H" level is applied to the gates of the n-type transistors 53B and 54B as the transfer gates in the upper data latch 50B, and the two transfer gates 53B and 54B are turned on.

The transfer gates 53 and 54 of the temporary latch 50A and the upper data latch 50B are turned on, such that the nodes n1 and n2 of the latches 50A and 50B are connected to the data bus DBUS at an "L" level (Vss) via the data bus switch 90 in an on-state.

Accordingly, both the nodes n1 and n2 of the flip-flops FF in the temporary latch 50A and the upper data latch 50B reach an "L" level. As a result, in the flip-flops FF in the temporary latch 50A and the upper data latch 50B, both the n-type transistors 51n and 52n are turned off, and both the p-type transistors 51p and 52p are turned on. Here, as the nodes n1 and n2 are at an "L" level, shoot-through currents running from the nodes n1 and n2 via the field effect transistors 51nA and 52nA can be prevented.

In this way, among the latches 50 included in the latch unit 341 in the column control circuit 3, the temporary latch 50A and the upper data latch 50B are set to a standby state. However, the data in the temporary latch 50A and the data latch 50B are destroyed.

On the other hand, during the standby operation for the temporary latch 50A and the upper data latch 50B, the control signal LLL<15:0> and the control signal LLI<15:0> for the lower data latch (LDL) 50C, for example, are set to an "L" level (potential VSS). As a result, the drive switches (p-type transistors) 55C and 56C in the lower data latch 50C are turned on, and the drive potential VDDSA is applied to the flip-flop FFC.

The control signal LTL<15:0> and the control signal LTI<15:0> for the lower data latch 50C are set to an "L" level. The transfer gates (n-type transistors) 53 and 54 in the lower data latch 50C are turned off. As a result, the nodes n1C and n2C of the lower data latch 50C are electrically disconnected from the data bus DBUS.

Thus, among the latches 50 included in each latch unit 341, the lower data latch 50C and the cache latch 50D that are kept active keep storing predetermined data without the destruction of the data.

As described above, when the latch 50 of the latch unit 341 is set to a standby state, the leak currents of the latches 50A and 50B in the standby state are substantially determined by the off-leak currents of the p-type transistors 51p and 52p. The power consumption of the latch 50 used in the flash memory according to the present embodiment is thus reduced as compared with that of a latch storing data or that of a latch of a different circuit configuration. For example, a leak current of about 20 μA is reduced.

The above-described operation may be performed for all the latches 50 included in the latch unit corresponding to the failure column unit CU and the failure column in accordance with the information on the failure column and control signals (enable/disable) corresponding to this information, in order to deactivate all the latches in the latch unit. This makes it possible to reduce the leak current of the latch 50 corresponding to the failure column unit and the failure column.

When a circuit in a standby state (here, the latch 50 in the data cache circuit 34) is restored as an operation target in accordance with the input of a command or an operation sequence, the operation for activating the circuit in the standby state is performed by the control circuit 8 (step ST4).

Figure 6:
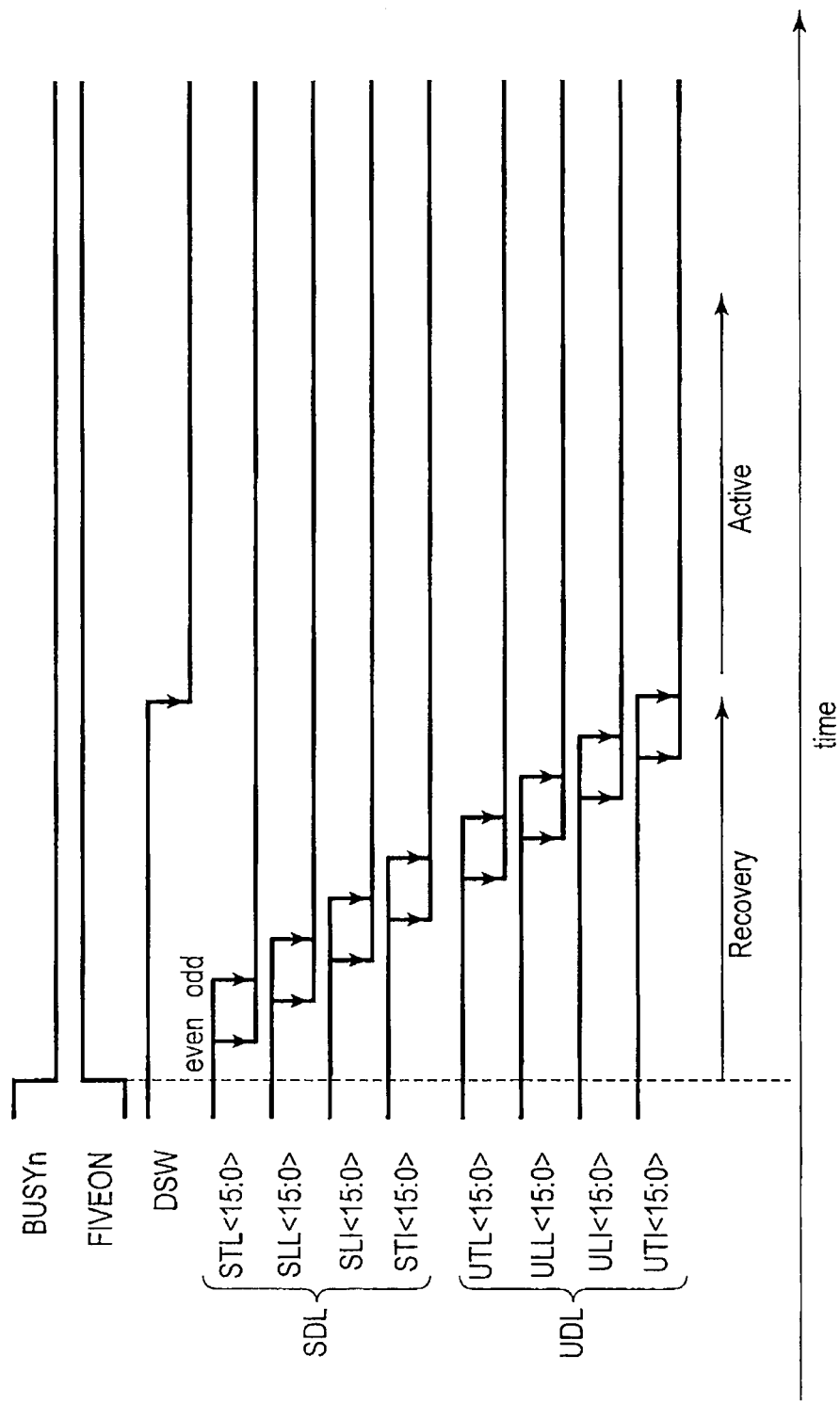
FIG. 6 is a timing chart showing an operation example of the semiconductor memory according to the first embodiment.

FIG. 6 shows a timing chart of the operation wherein the latch 50 in the latch unit 341 is shifted to an active state from a standby state. The operation for shifting the latch unit 341 to an active state from a standby state is hereinafter referred to as a recovery operation. The period from the start of the recovery operation to its end is hereinafter also referred to as a recovery period. Moreover, hereinafter, the period in which the standby state is maintained is also referred to as a standby period, and the period in which the active state is maintained is also referred to as an active period.

The recovery operation is performed, for example, during potential generation (pump wait) by the potential generating circuit. For example, the recovery operation is performed in a time-shared manner by different timings for each latch 50 and for each configuration in the latch 50 to reduce a peak current.

For example, as shown in FIG. 6, the recovery operation for the latch 50 in a standby state is started by the shift of the fiveon signal FIVEON to an "H" level from an "L" level in synchrony with the busy signal BUSYn.

At the start of the recovery operation for the latch 50, the control signal DSW for the data bus switch 90 is set to an "H" level, and the latch 50 targeted for the recovery operation is electrically connected to the data bus DBUS.

As shown in FIG. 6, when the recovery operation is started, the control signals STL<15:0> and STI<15:0> for the field effect transistors 55A and 56A of the temporary latches (SDL) 50A are shifted to an "L" level from an "H" level by the control circuit 8.

In this case, the signal levels (potential levels) of all the control signals STL corresponding to 16 control units (e.g., memory cell units) are not collectively set to an "L" level. The signal levels of the control signals STL<0>, <2>, <4> . . . <14> corresponding to even control units among the latches 50 (hereinafter represented by $STL_{even}$) are set to an "L" level. The signal levels of the odd control signals STL<1>, <3>, <5> . . . <15> among the latches 50 (hereinafter represented by $STL_{odd}$) are kept at an "H" level until the even control signals reach an "L" level. After the even control signals STL even are shifted to an "L" level, the odd control signals $STL_{odd}$ are shifted to an "L" level.

Thus, the overlapping of the generation timings of peak currents is avoided in the recovery operation for the latches 50, thereby preventing simultaneous generation of high peak currents.

When the control signal STL<15:0> is set to an "L" level, the transfer gate (n-type transistor) 53A in the temporary latch 50A is turned off. The node n1A of the flip-flop FFA in the temporary latch 50A is electrically disconnected from the interconnects at an "L" level.

For example, in a period in which the even control signal $STL_{even}$ and the odd control signal $STL_{odd}$ are shifted to an "L" level, the other control signals (here, the control signals SLL) are shifted to an "L" level.

For example, in the control signal SLL<15:0> of the p-type transistor 55 as the drive switch among the upper data latches 50A, the even control signals $SLL_{even}$ (SLL<0>, SLL<2> . . . ) are shifted to an "L" level from an "H" level between the time in which the signal levels of the even control signals $STL_{even}$ are shifted and the time in which the signal levels of the odd control signals $STL_{odd}$ are shifted so that the generation timings of peak currents do not overlap.

The odd control signals $SLL_{odd}$ (SLL<1>, SLL<3> . . . ) are then shifted to an "L" level from an "H" level so that the shift timings of the signal levels of these control signals do not overlap those of the other control signals.

When the control signal SLL<15:0> is set to an "L" level, the field effect transistor (drive switch) 55A in the temporary latch 50A is turned on. Here, as the nodes n1A and n2A are at an "L" level when the field effect transistor 55A is on, the field effect transistor 51nA is off. As a result, a shoot-through current running from the potential level of the potential VDDSA to the potential level of the potential VSSSA can be prevented. The drive potential VDDSA is applied to one inverter (p-type transistor 51p) of the flip-flop FF. Accordingly, the node n1A reaches an "H" level, so that the field effect transistor 52pA is turned off, and the field effect transistor 52nA is turned on.

For example, for the transfer gate 54A connected to the node n2A, the control signals $SLI_{even}$ (SLI<0>, SLI<2> . . . ) corresponding to even control units and the control signals $SLI_{odd}$ (SLI<1>, SLI<3> . . . ) corresponding to odd control units are set to an "L" level by different timings. Here, as the node n1A is at an "H" level when the field effect transistor 55A is on, the field effect transistor 52pA is off. As a result, a shoot-through current running from the level of the potential VDDSA to the level of the potential VSSSA can be prevented. Moreover, the transfer gates (n-type transistors) 54A are turned off in a dispersed manner for each of the even and odd control units, and the node n2A of the flip-flop FFA in each latch 50 is electrically disconnected from the data bus at an "L" level.

For the drive switches 56A in the upper data latches 50A, the even control signals $STI_{even}$ (SLI<0>, SLI<2> . . . ) and the odd control signals $STI_{odd}$ (SLI<0>, SLI<2> . . . ) are set to an "L" level from an "H" level by different timings.

As a result, the drive switch (p-type transistor) 56A in each upper data latch 50A is turned on, and the drive potential VDDSA is applied to one inverter (p-type transistor 52p) of the flip-flop FFA.

It is preferable that the timings of shifting the signal levels are controlled and shifted so that the times of the shifts of the signal levels of the control signals STL, SLL, SLI, and STI to an "L" level from an "H" level do not correspond, in order to reduce the peak current. Moreover, if the signal levels of the control signal STL, the control signal SLL, the control signal SLI, and the control signal STI are shifted to an "L" level from an "H" level in order, a shoot-through current running from the potential level of the potential VDDSA to the potential level of the potential VSSSA can be prevented. The order is not limited if no shoot-through current runs from the potential VDDSA to the potential VSSSA.

As described above, the temporary latch 50A is set to an active state from a standby state by the recovery operation for the temporary latch 50A.

As shown in FIG. 6, the recovery operation for the upper data latch (UDL) 50B is started after the recovery operation for the temporary latch 50A is performed. Although the recovery operation for the upper data latch 50B is performed after the recovery operation for the temporary latch 50A is performed in the example shown in FIG. 6, the order is not limited.

As in the recovery operation for the temporary latch 50A, the control signals UTL<15:0>, ULL<15:0>, ULI<15:0>, and UTI<15:0> of the components that form the upper data latch 50B are sequentially shifted to an "L" level from an "H" level so that the generation timings of peak currents are dispersed for each of the even and odd control units.

In the upper data latch 50B, by different timings, the transfer gates (n-type transistors) 53B and 54B corresponding to the even and odd control units UTL<15:0> and UTL<15:0> are turned off, and the drive switches (p-type transistors) 55B and 56B corresponding to the even and odd control units ULL<15:0> and ULI<15:0> are turned on.

Thus, the upper data latch 50B is activated by the recovery operation for the upper data latch 50B.

After each latch 50 targeted for the recovery operation is shifted to an active state from a standby state, the control signal DSW for the data bus switch 90 is shifted to an "L" level from an "H" level, and the data bus switch 90 is turned off. As a result, the latch unit 341 and the latch 50 are electrically disconnected from the data bus DBUS.

Accordingly, the latches 50A and 50B in the standby state are activated in the latch unit 341, and the latch unit 341 is driven.

For example, upper data corresponding to lower data stored in the lower data latch 50C may be transferred to the upper data latch 50B which has been shifted to an active state from a standby state.

As shown in FIG. 6, the timings for restoring the latches 50 targeted for the recovery operation and the transistors that form the latches 50 are dispersed, such that the peak current generated during the recovery operation can be reduced.

For example, when the recovery operation is performed for the two latches 50A and 50B included in the latch unit as in the example shown in FIG. 6, the recovery operation is performed, for example, in an operation period of about 1 μs.

After the recovery operation, a predetermined operation is performed in accordance with an input command. The control circuit 8 repeats the above-described standby operation and recovery operation for the data cache circuit 34 or the other circuits in accordance with the operation of the memory.

As shown in FIG. 4 to FIG. 6, the operation of the flash memory according to the present embodiment is performed. Here, the operation performed by the control circuit 8 for the latch 50 in the data cache circuit 34 is shown. However, the internal configuration (e.g., the sense amplifier unit 321) in the sense amplifier circuit 32 or the internal configuration (e.g., the local column decoder 301) in the column decoder 30 may be set to an inactive state (standby state) by the control circuit 8 depending on the operation status of the columns of the memory cell array.

In the flash memory according to the present embodiment, the circuit which is not targeted for operation (not selected) is set to a standby state by the control circuit 8 during the operation of the memory.

For example, among the latches 50 included in the latch unit 341 in the data cache circuit 34, the latches 50A and 50B which allow the data therein to be destroyed are set to a standby state when the latch unit 341 is not selected.

In the latch unit 341, the drive switches 55 and 56 that form the latch 50 are turned off. At this moment, the potential VDDA is applied to the gates of the p-type transistors 55 and 56 as the drive switches.

The n-channel type field effect transistors as the transfer gates 53 and 54 of the latch 50 are turned on, and the potential levels of the two nodes n1 and n2 of the flip-flop are set to the ground potential ("0" level) VSS.

As a result, both the n-type transistors $51n$, $52n$ that form the flip-flop FF of the latch 50 are turned off, and both the p-type transistors $51p$ and $52p$ that form the flip-flop FF are turned on.

In the present embodiment, the two n-type transistors $51n$ and $52n$ that form the flip-flop FF of the latch 50 are turned off. Thus, the intensity of the off-leak current generated in the latch 50 is hardly influenced by the leak currents of the n-type transistors $51n$ and $52n$ and only depends on the leak currents of the p-type transistors 55 and 56. Therefore, in the flash memory according to the present embodiment, the leak current of the latch 50 in the data cache circuit 34 in a standby state can be reduced as compared with that of a latch storing data or that of a latch of a different circuit configuration.

Consequently, the flash memory according to the present embodiment can reduce its power consumption by setting the latches 50 included in the latch unit 341 to a standby state (inactive state).

In the present embodiment, the leak current can be reduced, so that the effect of noise resulting from the leak current can also be reduced.

In the operation of the flash memory according to the present embodiment, when the recovery operation is performed for the latch 50 in the latch unit 341 in a standby state and the components of this latch 50, the timing of shifting the control signal is time-shared, for example, for each latch or for each component corresponding to the even or odd control unit.

Thus, the generation timings of peak currents during the recovery operation are dispersed. As a result, the flash memory according to the present embodiment can reduce the peak current generated during the recovery operation for the circuits (here, the latch 50 in the latch unit 341) in a standby state.

As described above, according to the semiconductor memory of the present embodiment and its operation, the power consumption of the memory can be reduced.

(2) Second Embodiment

A semiconductor memory (e.g., flash memory) according to the second embodiment and its operation are described with reference to FIG. 7 and FIG. 8.

In the present embodiment, a method of controlling data latch in the flash memory so that the increase of a standby current can be further inhibited than in the first embodiment is described.

Figure 7:
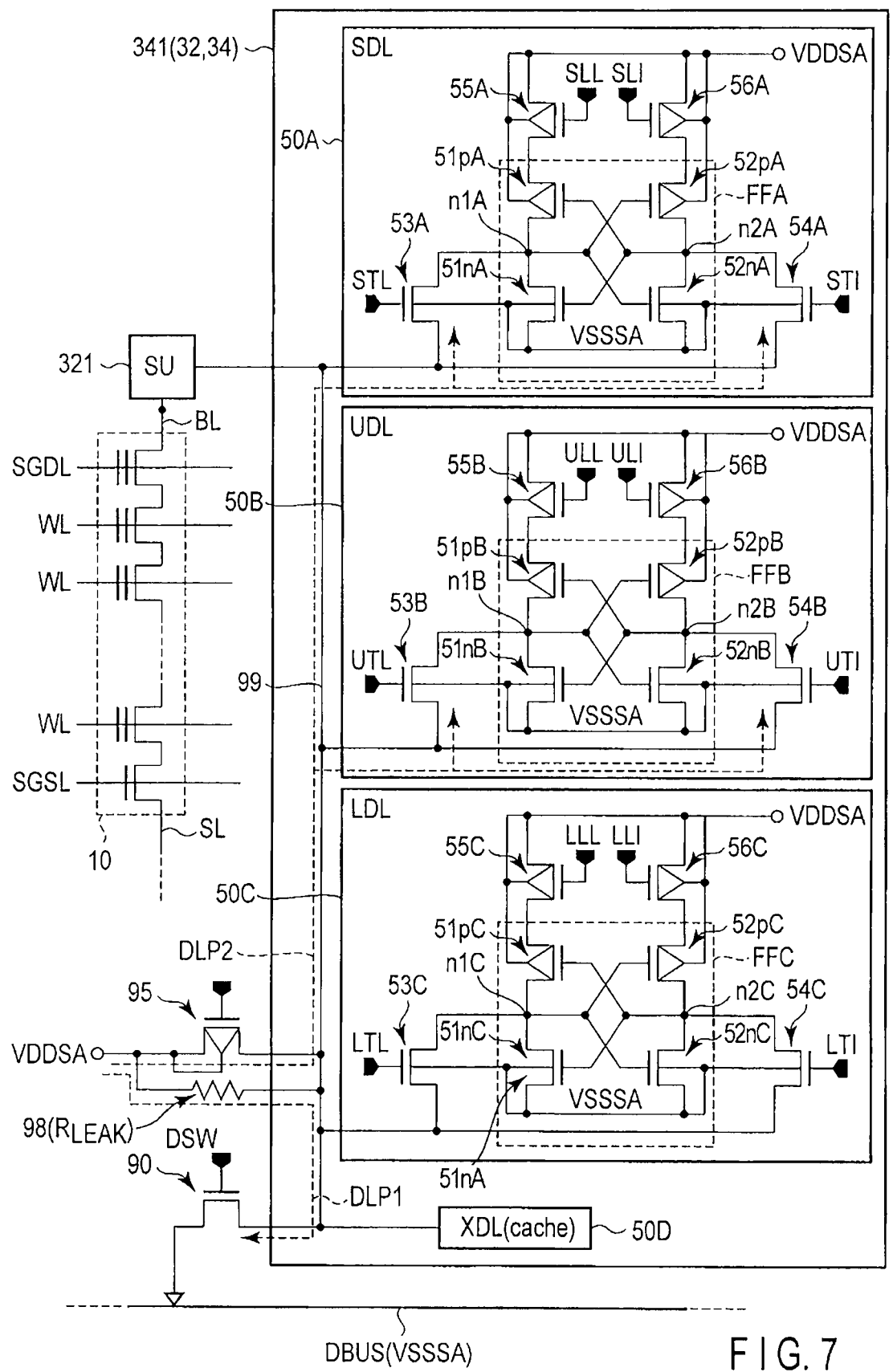
FIG. 7 is an equivalent circuit diagram showing a configuration example of a latch included in a semiconductor memory according to a second embodiment.

FIG. 7 shows the circuit configuration of a latch included in a data cache circuit 34 of the flash memory. The basic configuration of the circuit 34 shown in FIG. 7 is substantially the same as that of the circuit shown in FIG. 3. However, as shown in FIG. 7, a weak short circuit (leak path) 98 may be present between a power supply VDDSA and a common interconnect 99, for example, due to a defect in a manufacturing process. The leak path 98 has a resistance $R_{LEAK}$. This leak path 98 may be a high-resistance short circuit between interconnects or may be a leakage through a transistor. For example, a p-type transistor 95 as a charge switch 95 is connected to the common interconnect 99. When this p-type transistor 95 includes a defect such as a crystal defect, a charge is injected to a drain from a semiconductor substrate (N-well region), and a leakage is caused.

If, while such a leakage is being caused to the power supply VDDSA, latch unit in the sense amplifier circuit 31 and the data cache circuit 34 is controlled during standby operation in accordance with the operation in the first embodiment shown in FIG. 5, an N-type transistor 90 as a data bus switch 90 to which a control signal DSW is input is turned on, and a data bus DBUS is set to an "L" level (potential VSSSA). Thus, a direct-current current path (hereinafter referred to as a first direct-current current path) DLP1 including the leak path 98, the common interconnect 99, the on-state transistor (data bus switch) 90, and the data bus DBUS is generated between the high potential end (power supply) VDDSA and the low potential end (data bus) VSSSA. Due to the generation of this direct-current current path DLP1, the current (leak current) consumed by the flash memory on standby may increase.

When N-type transistors (transfer gates) 53A and 54A which connect a latch (SDL) 50A to the common interconnect 99 and N-type transistors 53B and 54B which connect a latch (UDL) 50B to the common interconnect 99 are all on, a rise in the potential of the common interconnect 99 resulting from the inflow of a charge from the leak path 98 increases the potentials of nodes n1A, n1B, n2A, and n2B via the on-state transistors 53A, 53B, 54A, and 54B. When the gate terminals of n-type transistors $51n$A, $52n$A, $51n$B, and $52n$B that form flip-flops FFA and FFB in the latches 50A and 50B are floating due to the rise in the potential of the common interconnect 99, the n-type transistors 51nA, 52nA, 51nB, and 52nB may be unintentionally turned on. In this condition, a direct-current current path (hereinafter referred to as a second direct-current current path) DLP2 extending through the leak path 98, the common interconnect 99, the n-type transistors (transfer gates) 53A, 53B, 54A, and 54B, and the n-type transistors 51nA, 52nA, 51nB, and 52nB of the flip-flops FFA and FFB can be formed between the high potential end VDDSA and the low potential end VSSSA. This direct-current current path DLP2 also increases the current consumed during standby.

Figure 8:
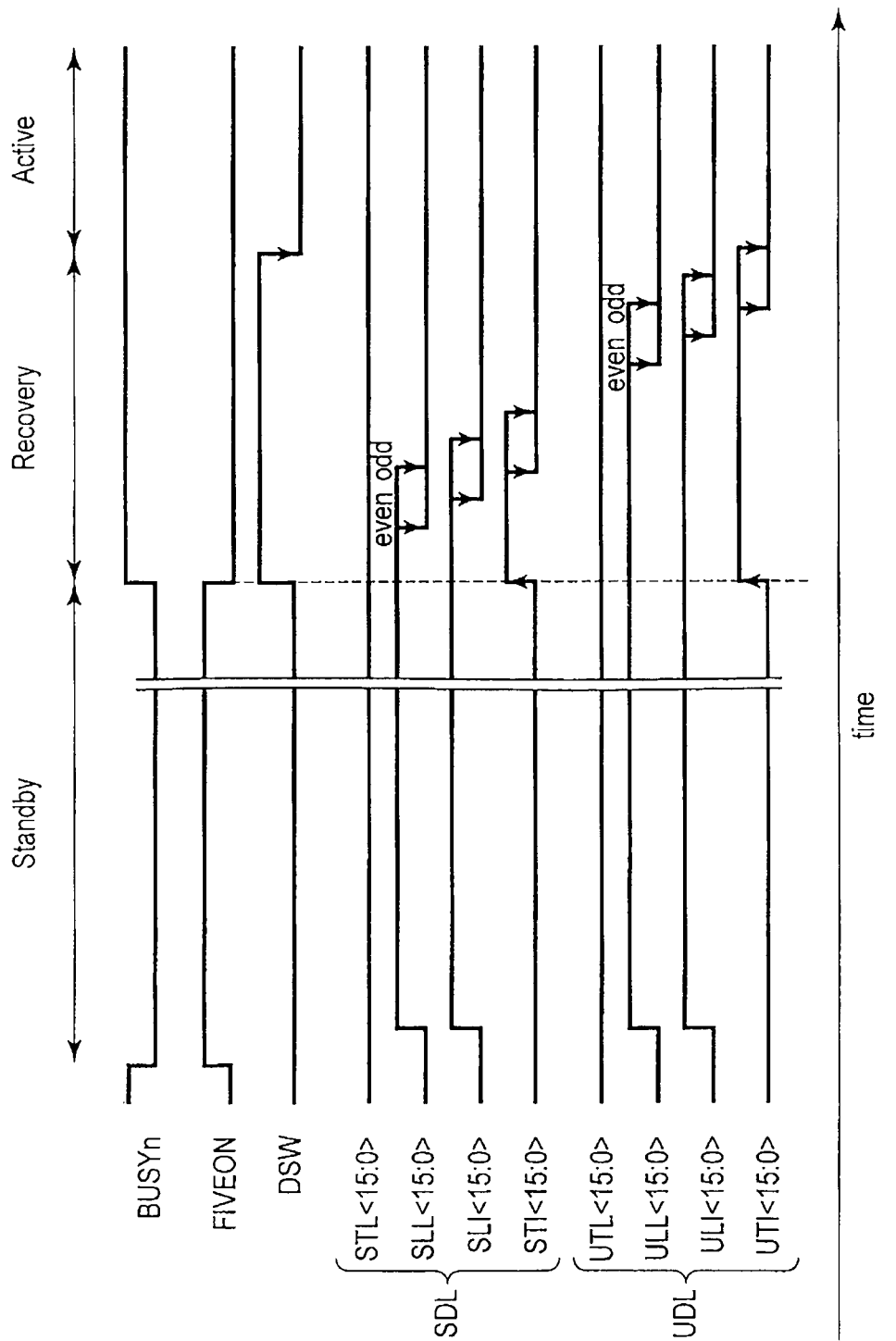
FIG. 8 is a timing chart showing an operation example of the semiconductor memory according to the second embodiment.

FIG. 8 is a timing chart showing the operation of the flash memory according to the second embodiment. FIG. 8 shows the shifts (on/off states of the transistors) of the signal levels of control signals of the transistors in the control method of the flash memory according to the present embodiment.

FIG. 8 shows the method of controlling the sense amplifier circuit 32 or the data cache circuit 34 and the latches 50A and 50B in the sense amplifier circuit 32 or the data cache circuit 34 of the flash memory when the defect (leak path) 98 that causes the inflow of a charge to the common interconnect 99 shown in FIG. 7 is present. The current consumption (leak current) resulting from the leak path 98, DLP1, and DLP2 during standby operation can be reduced by the operations of the data cache circuit 34 and the latches 50A and 50B shown in FIG. 8.

The method of controlling the latch 50 included in the sense amplifier circuit 32 or the data cache circuit 34 in FIG. 8 is different from the control method according to the first embodiment (see FIG. 5 and FIG. 6) in that the control signal DSW is not set to an "H" level and is kept at an "L" level during a standby state (standby period) and the control signal. DSW is shifted to an "H" level from an "L" level after a change from the standby state to the recovery state (recovery period).

The method of controlling the latches 50 included in the sense amplifier circuit 32 or the data cache circuit 34 in FIG. 8 is also different from the control method shown in FIG. 5 and FIG. 6 in the following points. Control signals STL, STI, UTL, and UTI supplied to the gates of the n-type transistors (transfer gates) 53A, 53B, 54A, and 54B which connect the latches 50A, 50B, and 50C to the common interconnect 99 are not set to an "H" level during the standby period. The signal levels of the control signals STL, STI, UTL, and UTI are controlled so that the control signals STI and UTI are set to an "H" level from an "L" level after a change from the standby state to the recovery state.

As shown in FIG. 8, during the standby state of the flash memory, the control signal DSW for the data bus switch 90 is set to an "L" level by the control circuit 8. Therefore, the n-type transistor 90 as the data bus switch is off. Thus, the common interconnect 99 is electrically disconnected from the data bus DBUS which is connected to the low potential end VSSSA, and the common interconnect 99 which is charged due to the leak path 98 is not discharged. Therefore, the connection between the first direct-current current path DLP1 and the data bus DBUS is shut off by the transistor 90 in an off-state.

Similarly, during the standby state of the flash memory, the control signals STL, STI, UTL, and UTI for the n-type transistors 53A, 54A, 53B, and 54B as the transfer gates in the latch 50A, 50B are set to an "L" level by the control circuit 8. Therefore, the n-type transistors 53A, 54A, 53B, and 54B are off. The nodes n1A, n2A, n1B, and n2B of the latches (SDL/UDL) 50A and 50B are electrically disconnected from the common interconnect 99 by the n-type transistors 53A, 54A, 53B, and 54B in an off-state, and the second direct-current current path DLP2 is also shut off.

In the recovery operation, the control signal DSW is set to an "H" level from an "L" level. Synchronously with the shift of the control signal DSW to an "H" level, the control signals STL, STI, UTL, and UTI are shifted to an "H" level from an "L" level, and the n-type transistors 53A, 54A, 53B, and 54B as the transfer gates are turned on.

In FIG. 8, the control signals STI and UTI on one side are set to an "H" level, and the STL and UTL on the other side are set to an "L" level, so that among the n-type transistors 53A, 54A, 53B, and 54B as the two transfer gates in the latches 50A and 50B, the transistors 54A and 54B on one side alone are turned on. In contrast to this control, the control signals STI and UTI on one side may be kept at an "L" level, and the STL and UTL on the other side may be sot to an "H" level, so that the transistors 53A and 53B may be turned on. Alternatively, both the control signals STI and UTI may be set to an "H" level, and both the transfer gates of the latches 50A and 50B may be turned on.

Thus, from the standby period (standby state) to the turning on of the transistor, the common interconnect 99 and the nodes n1A, n2A, n1B, and n2B in the latches (SDL/UDL) are all floating due to the operation of the data latch circuit in the second embodiment. According to the operation of the flash memory shown in FIG. 8, the off-leak current of the transistor is reduced, and the increase of the current consumption resulting from the leak current of the flash memory on standby can be prevented even if an element or interconnect has a defect that permits a charge to flow into the common interconnect 99.

In the first embodiment, the potential of the common interconnect 99 is set to an "L" level by the data bus switch 90 in an on-state. Therefore, in the latch (LDL) 50C in the data cache circuit 34 which is not in a standby state (inactive state), the off-leak current may be generated in one of the two n-type transistors 53C and 54C as the transfer gates in the latch 50C in accordance with the data held in the latch 50C.

That is, in the flash memory according to the first embodiment, both the control signals LTL and LTI of the transistors 53C and 54C which connect the latch 50C to the common interconnect 99 are set to an "L" level by the control circuit 8. Therefore, the gates of the transistors 53C and 54C are set to an "L" level, the sources of the transistors 53C and 54C are set to an "L" level which is the potential of the common interconnect 99, and data at an "H" level is stored in the drain terminals of the transistors 53C or 54C.

In contrast, in the flash memory according to the second embodiment, when the control method shown in FIG. 8 is used for the operation of the sense amplifier circuit 32 and the data cache circuit 34 and latches therein of the flash memory, the common interconnect 99 is not electrically connected to the data bus DBUS at the ground potential and is floating because the control signal DSW for the data bus switch 90 is set to an "L" level during the standby period. Therefore, in the second embodiment, the off-leak currents from the transistors 53C and 54C of the latch 50C which are not deactivated have nowhere to flow, so that one of the n-type transistors 53C and 54C does not cause leak-off.

As a result, according to the second embodiment, the off-leak current of one n-type transistor is reduced in each latch 50C which is active during the standby period of the flash memory. Therefore, the flash memory according to the second embodiment can further reduce the current consumed in the whole sense amplifier circuit 32 and the whole data cache circuit 34 including the latches during standby.

As described above, according to the control method of the flash memory of the second embodiment, the power consumption of the memory can be reduced.

[Addition]

The flash memory has been shown as an example of the semiconductor memory in the embodiments. However, the embodiments are also applicable to memories such as a magnetoresistive RAM (MRAM), a resistive RAM (ReRAM), and a phase change RAM (PCRAM) as long as the method of controlling the columns of a memory cell array is substantially the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
   a memory cell array including memory cells to store data;
   at least one first latch including first transistors and a first flip-flop to hold data;
   at least one second latch including second transistors and a second flip-flop to hold data; and
   a control circuit configured to, by turning off the first transistors, deactivate the first latch and maintain the second latch in an active state when a busy/ready signal changes from a first voltage to a second voltage, wherein the second voltage is larger than the first voltage.

2. The semiconductor memory according to claim 1, wherein the the first latch is a temporary latch.

3. The semiconductor memory according to claim 1, wherein the second latch is a data latch used for cache reading.

4. The semiconductor memory according to claim 1, wherein
   when a failure bit line is in a control unit allocated to a column of the memory cell array,
   the control unit includes a plurality of first latches, and
   the control circuit deactivates all first latches in the control unit including the failure bit line.

5. The semiconductor memory according to claim 1, wherein when the busy/ready signal changes from the second voltage to the first voltage the control circuit activates first latches by different timings.

6. The semiconductor memory according to claim 1, wherein
   the first flip-flop includes first and second n-channel type transistors and first and second p-channel type transistors, and
   the first transistors include a first drive switch configured to control the application of a drive potential to the first p-channel type transistor, and a second drive switch configured to control the application of a drive potential to the second p-channel type transistor.

7. The semiconductor memory according to claim 6, wherein the first transistors include a first transfer gate electrically connected to a first node of the first flip-flop, and a second transfer gate electrically connected to a second node of the first flip-flop.

8. The semiconductor memory according to claim 7, wherein when the first latch is deactivated, the control circuit is configured to turn off the first and second drive switches and set the potential levels of the first and second nodes to low potential levels.

9. The semiconductor memory according to claim 7, wherein when the first latch is deactivated, the control circuit is configured to turn off at least one of the first and second transfer gates.

10. The semiconductor memory according to claim 7, wherein when the first latch is set to an active state from an inactive state, at least one of the first and second transfer gates is turned on synchronously with the busy/ready signal.

11. The semiconductor memory according to claim 7, wherein when the first latch is set to an active state from an inactive state, the control circuit is configured to turn on at least one of the first and second drive switches after turning on at least one of the first and second transfer gates.

12. The semiconductor memory according to claim 7, wherein when a data storing state of the first latch is inverted,
    the control circuit is configured to set a common interconnect connected to first latches to a low potential and turn on the drive switches connected to a high potential end, and
    one of the first and second transfer gates is then turned on.

13. The semiconductor memory according to claim 7, wherein in the first transistors and the first and second n-channel type transistors and the first and second p-channel type transistors included in the first flip-flop, an off-leak current of the n-channel type transistor is lower than an off-leak current of the p-channel type transistor.

14. The semiconductor memory according to claim 1, further comprising:
    a common interconnect to which a plurality of first latches are electrically connected; and
    a signal line connected to the common interconnect via a first control switch.

15. The semiconductor memory according to claim 14, wherein
    when the first latch is set to an active state from an inactive state, the control circuit is configured to turn on the first control switch and connect the common interconnect to the signal line, and
    after the first latch is set to the active state, the control circuit is configured to turn off the first control switch and electrically disconnect the common interconnect from the signal line.

16. The semiconductor memory according to claim 14, wherein
    when the first latch is set to an active state from an inactive state, the control circuit is configured to turn off the first control switch and electrically disconnect the common interconnect from the signal line, and
    after the first latch is set to the active state, the control circuit is configured to turn off the first control switch and electrically disconnect the common interconnect from the signal line.

17. A semiconductor memory control method comprising:
    controlling, by a control circuit, input or output of data between a memory cell array, at least one of a first latch and at least one of a second latch, the first latch including first transistors and a first flip-flop, and the second latch including second transistors and a second flip-flop; and
    turning off, by the control circuit, the first transistors to deactivate the first latch, wherein the control circuit maintains an active state when a busy/ready signal changes from a first voltage to a second voltage, wherein the second voltage is larger than the first voltage.

18. The semiconductor memory control method according to claim 17, wherein the first latch temporarily stores data to be written into a memory cell, and the second latch is used for cache reading.

19. The semiconductor memory control method according to claim 17, wherein
- the first transistors include first and second drive switches and first and second transfer gates,
- when the first latch is deactivated, the control circuit is configured to turn off the first and second drive switches and set potential levels of first and second nodes of the first flip-flop to which the first and second transfer gates are electrically connected, respectively, to low potential levels, and
- when the first latch is set to an active state from an inactive state, the control circuit is configured to turn on at least one of the first and second transfer gates after turning on at least one of the first and second drive switches.

20. The semiconductor memory control method according to claim 17, wherein
- the first transistors include first and second drive switches and first and second transfer gates,
- when the first latch is deactivated, the control circuit is configured to turn off at least one of the first and second transfer gates, and
- when the first latch is set to an active state from an inactive state, the at least one of the first and second transfer gates is turned on synchronously with the busy/ready signal.

* * * * *